(12) United States Patent
Khlat et al.

(10) Patent No.: US 10,911,001 B2
(45) Date of Patent: Feb. 2, 2021

(54) ENVELOPE TRACKING AMPLIFIER CIRCUIT

(71) Applicant: Qorvo US, Inc., Greensboro, NC (US)

(72) Inventors: Nadim Khlat, Cugnaux (FR); James M. Retz, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 4 days.

(21) Appl. No.: 16/246,859

(22) Filed: Jan. 14, 2019

(65) Prior Publication Data

US 2020/0106392 A1 Apr. 2, 2020

Related U.S. Application Data

(60) Provisional application No. 62/739,986, filed on Oct. 2, 2018.

(51) Int. Cl.
| | |
|---|---|
| *H03F 1/02* | (2006.01) |
| *H03F 3/19* | (2006.01) |
| *H04W 52/04* | (2009.01) |

(52) U.S. Cl.
CPC ............ *H03F 1/0227* (2013.01); *H03F 3/19* (2013.01); *H04W 52/04* (2013.01); *H03F 2200/102* (2013.01); *H03F 2200/321* (2013.01); *H03F 2200/451* (2013.01)

(58) Field of Classification Search
USPC .......................... 330/290–291, 136, 297, 279
See application file for complete search history.

(56) References Cited

U.S. PATENT DOCUMENTS

| | | |
|---|---|---|
| 5,838,732 A | 11/1998 | Carney |
| 6,107,862 A | 8/2000 | Mukainakano et al. |
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |

(Continued)

OTHER PUBLICATIONS

Non-Final Office Action for U.S. Appl. No. 14/836,634, dated May 16, 2016, 9 pages.

(Continued)

*Primary Examiner* — Hieu P Nguyen
(74) *Attorney, Agent, or Firm* — Withrow & Terranova, P.L.L.C.

(57) ABSTRACT

An envelope tracking (ET) amplifier circuit is provided. The ET amplifier circuit includes an ET voltage circuit configured to generate an ET modulated voltage based on a supply voltage for amplifying a radio frequency (RF) signal. The ET modulated voltage corresponds to a time-variant voltage envelope, which can be misaligned from a time-variant signal envelope of the RF signal due to an inherent temporal delay in the ET amplifier circuit. A voltage processing circuit is provided in the ET amplifier circuit to reduce dynamic range of the ET modulated voltage to help improve delay sensitivity in the ET amplifier circuit. A control circuit is configured to reduce the supply voltage according to the dynamic range to help maintain system-wide efficiency of the ET amplifier circuit at a defined level. As such, it may be possible to improve delay sensitivity and maintain sufficient system-wide efficiency in the ET amplifier circuit.

21 Claims, 7 Drawing Sheets

(56) References Cited

U.S. PATENT DOCUMENTS

| | | |
|---|---|---|
| 8,461,928 B2 | 6/2013 | Yahav et al. |
| 8,493,141 B2 | 7/2013 | Khlat et al. |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,239 B2 * | 2/2016 | Drogi ..................... H03F 3/189 |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,981 B2 | 3/2017 | Khlat |
| 9,596,110 B2 | 3/2017 | Jiang et al. |
| 9,614,477 B1 * | 4/2017 | Rozenblit ............. H03F 1/0227 |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |

OTHER PUBLICATIONS

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

Notice of Allowance for U.S. Appl. No. 15/459,449, dated Mar. 28, 2018, 7 pages.

Notice of Allowance for U.S. Appl. No. 15/723,460, dated Jul. 24, 2018, 8 pages.

Notice of Allowance for U.S. Appl. No. 15/704,131, dated Jul. 17, 2018, 7 pages.

Notice of Allowance for U.S. Appl. No. 15/728,202, dated Aug. 2, 2018, 7 pages.

Non-Final Office Action for U.S. Appl. No. 15/888,300, dated Aug. 28, 2018, 11 pages.

Notice of Allowance for U.S. Appl. No. 15/792,909, dated Dec. 19, 2018, 11 pages.

Notice of Allowance for U.S. Appl. No. 15/993,705, dated Oct. 31, 2018, 7 pages.

Pfister, Henry, "Discrete-Time Signal Processing," Lecture Note, pfister.ee.duke.edu/courses/ece485/dtsp.pdf, Mar. 3, 2017, 22 pages.

(56) References Cited

OTHER PUBLICATIONS

Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
U.S. Appl. No. 16/122,611, filed Sep. 5, 2018.
U.S. Appl. No. 15/984,566, filed May 21, 2018.
U.S. Appl. No. 15/986,948, filed May 23, 2018.
U.S. Appl. No. 16/018,426, filed Jun. 26, 2018.
U.S. Appl. No. 16/174,535, filed Oct. 30, 2018.
Final Office Action for U.S. Appl. No. 15/986,948, dated Aug. 27, 2019, 9 pages.
Final Office Action for U.S. Appl. No. 16/018,426, dated Sep. 4, 2019, 12 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Notice of Allowance for U.S. Appl. No. 16/354,234, dated Apr. 24, 2020, 9 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.

* cited by examiner

ENVELOPE TRACKING AMPLIFIER CIRCUIT

RELATED APPLICATIONS

This application claims the benefit of U.S. provisional patent application Ser. No. 62/739,986, filed on Oct. 2, 2018, which is incorporated herein by reference in its entirety.

This application is related to U.S. Pat. No. 9,595,981 B2 entitled "REDUCED BANDWIDTH ENVELOPE TRACKING," issued on Mar. 14, 2017, which is incorporated herein by reference in its entirety.

This application is also related to U.S. patent application Ser. No. 16/174,535 entitled "ENVELOPE TRACKING AMPLIFIER CIRCUIT," filed on Oct. 30, 2018, which is incorporated herein by reference in its entirety.

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltages applied to the PAs to ensure that the PAs are operating at a higher efficiency for a given instantaneous output power requirement of the RF signals.

However, the envelope tracking system can only maintain good linearity and high efficiency up to an inherent bandwidth limit. In the advent of fifth-generation new radio (5G-NR) technology, the RF signals may be modulated with a higher bandwidth (e.g., >100 MHz) than the inherent bandwidth limit of the envelope tracking system, thus reducing linearity and efficiency of the envelope tracking system. As such, it may be desirable to improve linearity and efficiency of the envelope tracking system to support the 5G-NR technology.

SUMMARY

Aspects disclosed in the detailed description include an envelope tracking (ET) amplifier circuit. The ET amplifier circuit includes an ET voltage circuit configured to generate an ET modulated voltage based on a supply voltage for amplifying a radio frequency (RF) signal. The ET modulated voltage corresponds to a time-variant voltage envelope, which can be misaligned from a time-variant signal envelope of the RF signal due to an inherent temporal delay in the ET amplifier circuit. In this regard, a voltage processing circuit is provided in the ET amplifier circuit to reduce a dynamic range of the ET modulated voltage to help improve delay sensitivity in the ET amplifier circuit. A control circuit is configured to reduce the supply voltage according to the dynamic range to help maintain system-wide efficiency of the ET amplifier circuit at a defined level. As such, it may be possible to improve delay sensitivity and maintain sufficient system-wide efficiency in the ET amplifier circuit, particularly when the RF signal is modulated at a high-bandwidth (e.g., >60 MHz).

In one aspect, an ET amplifier circuit is provided. The ET amplifier circuit includes an ET voltage circuit configured to operate in a low-bandwidth mode and a high-bandwidth mode. The ET voltage circuit includes at least one voltage amplifier configured to generate an ET modulated voltage based on a supply voltage. The ET amplifier circuit also includes a supply voltage circuit configured to provide the supply voltage to the at least one voltage amplifier. The ET amplifier circuit also includes a voltage processing circuit configured to cause the ET voltage circuit to reduce a dynamic range of the ET modulated voltage in the high-bandwidth mode. The ET amplifier circuit also includes a control circuit configured to control the supply voltage circuit to reduce the supply voltage in the high-bandwidth mode based on the dynamic range of the ET modulated voltage.

In another aspect, an ET amplifier circuit is provided. The ET amplifier circuit includes an ET voltage circuit configured to operate in a low-bandwidth mode and a high-bandwidth mode. The ET voltage circuit includes at least one voltage amplifier configured to generate an ET modulated voltage having a time-variant voltage envelope based on a supply voltage and a target voltage having a time-variant target voltage envelope. The ET voltage circuit also includes a supply voltage circuit configured to provide the supply voltage to the at least one voltage amplifier. The ET voltage circuit also includes a signal processing circuit configured to generate an RF signal corresponding to a time-variant signal envelope. The ET voltage circuit also includes an amplifier circuit configured to amplify the RF signal based on the ET modulated voltage. The ET voltage circuit also includes a voltage processing circuit configured to cause the ET voltage circuit to reduce a dynamic range of the ET modulated voltage in the high-bandwidth mode. The ET voltage circuit also includes a control circuit configured to control the supply voltage circuit to reduce the supply voltage in the high-bandwidth mode based on the dynamic range of the ET modulated voltage to cause a system-wide efficiency to be maintained at a defined level.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) amplifier circuit. The ET amplifier circuit includes an ET voltage circuit configured to generate an ET modulated voltage based on a supply voltage for amplifying a radio frequency (RF) signal. The ET modulated voltage corresponds to a time-variant voltage envelope, which can be misaligned from a time-variant signal envelope of the RF signal due to an inherent temporal delay in the ET amplifier circuit. In this regard, a voltage processing circuit is provided in the ET amplifier circuit to reduce a dynamic range of the ET modulated voltage to help improve delay sensitivity in the ET amplifier circuit. A control circuit is configured to reduce the supply voltage according to the dynamic range to help maintain system-wide efficiency of the ET amplifier circuit at a defined level. As such, it may be possible to improve delay sensitivity and maintain sufficient system-wide efficiency in the ET amplifier circuit, particularly when the RF signal is modulated at a high-bandwidth (e.g., >60 MHz).

Figure 1A:
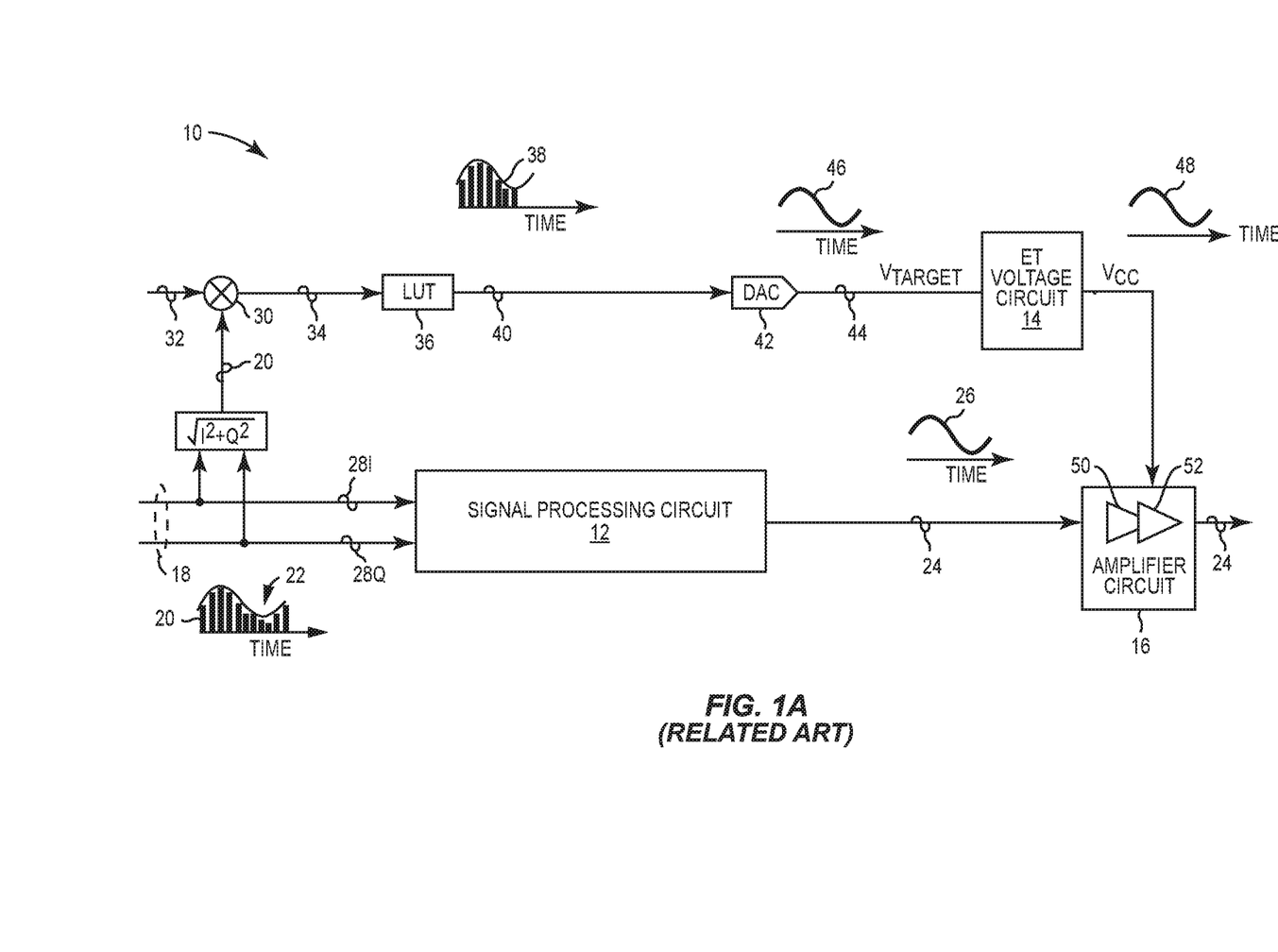
FIG. 1A is a schematic diagram of an exemplary existing envelope tracking (ET) amplifier circuit that can experience degraded overall linearity performance as a result of inherent processing and/or propagation delays of the existing ET amplifier circuit.
Figure 1B:
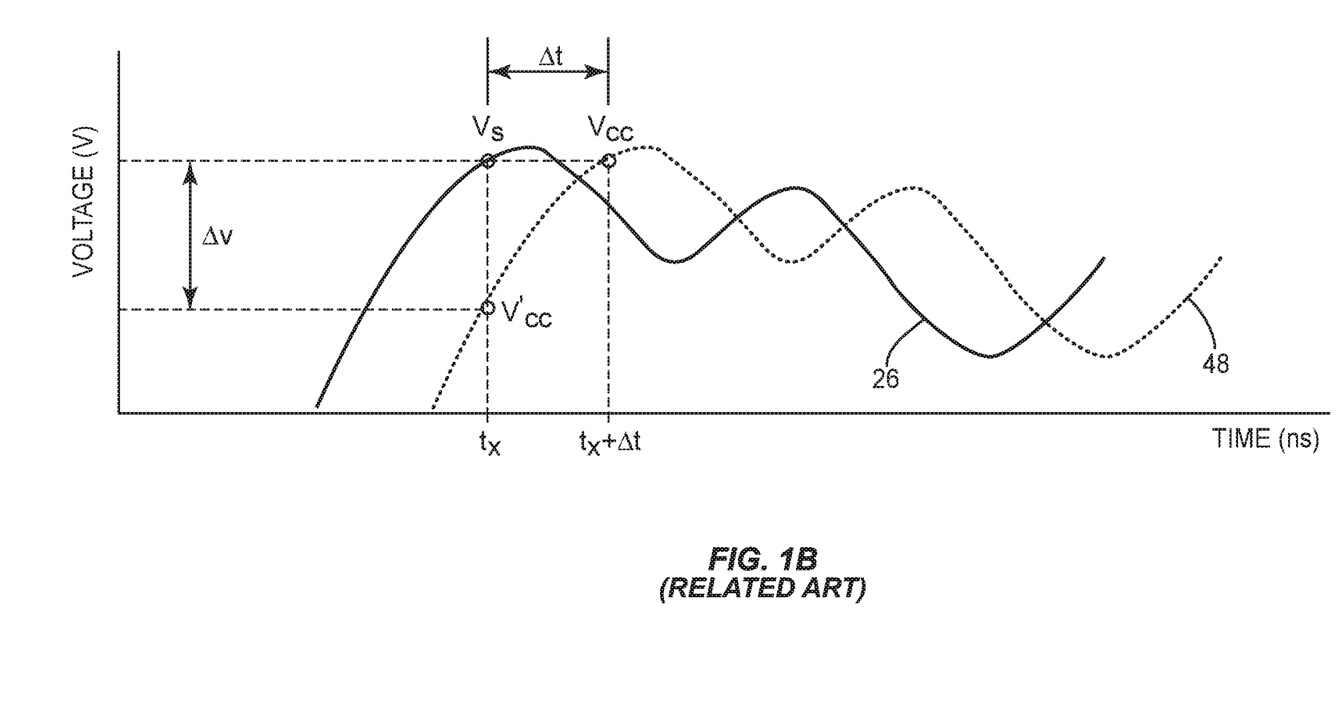
FIG. 1B is a graphic diagram providing an exemplary illustration of a temporal misalignment between a time-variant voltage envelope and a time-variant signal envelope that can occur in the existing ET amplifier circuit of FIG. 1A.
Figure 1C:
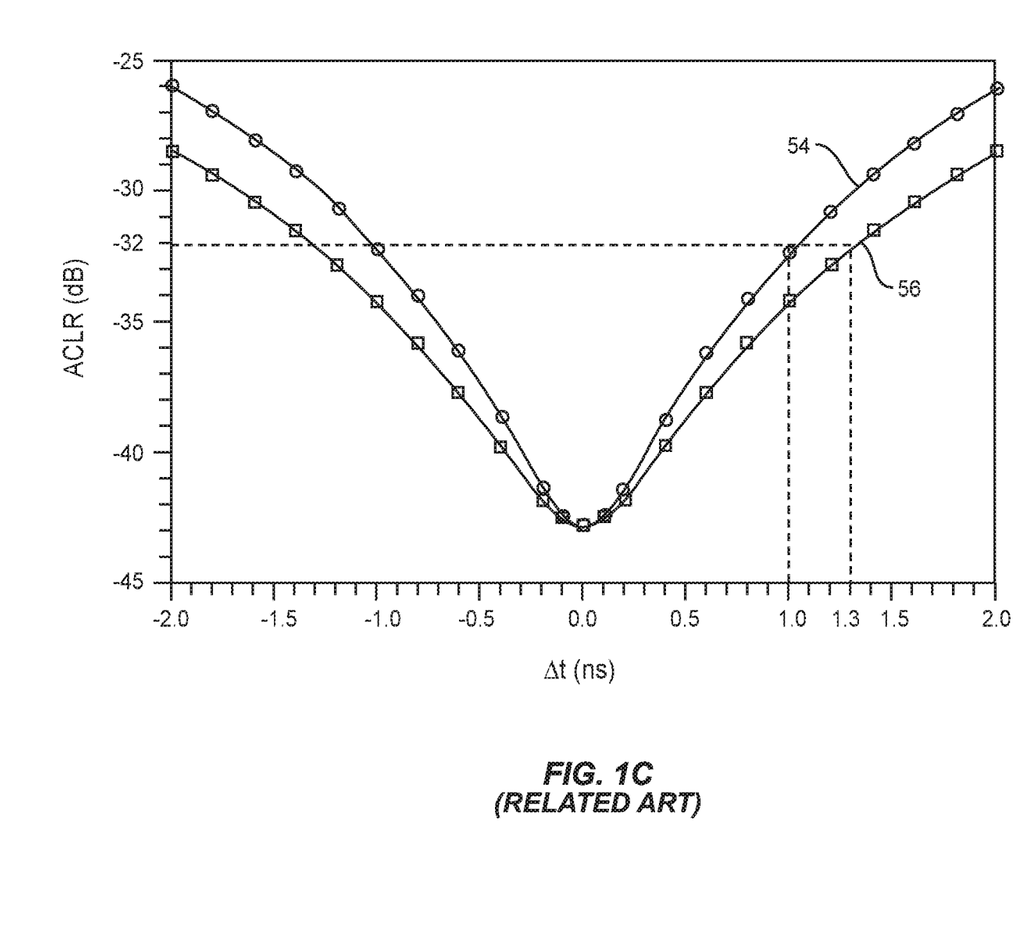
FIG. 1C is a graphic diagram providing an exemplary illustration of how a temporal delay can affect adjacent channel leakage ratio (ACLR) of an amplifier circuit in the existing ET amplifier circuit of FIG. 1A.

Before discussing an ET amplifier circuit of the present disclosure, a brief overview of an existing ET amplifier circuit that may experience degraded overall linearity performance as a result of inherent temporal delay associated with the existing ET amplifier circuit is first provided with reference to FIGS. 1A-1C. The discussion of specific exemplary aspects of the ET amplifier circuit of the present disclosure starts below with reference to FIG. 2.

FIG. 1A is a schematic diagram of an exemplary existing ET amplifier circuit 10 that can experience a degraded overall linearity performance as a result of inherent processing and/or propagation delays of the existing ET amplifier circuit 10. The existing ET amplifier circuit 10 includes a signal processing circuit 12, an ET voltage circuit 14, and an amplifier circuit 16. The signal processing circuit 12 receives a digital signal 18 that includes a number of time-variant digital signal amplitudes 20 representing a time-variant digital signal envelope 22. The phrase "time-variant" is used hereinafter to refer to a parameter (e.g., amplitude, voltage, power, etc.) that changes (e.g., increases or decreases) over time.

The signal processing circuit 12 is configured to convert the digital signal 18 into an RF signal 24 having a time-variant signal envelope 26 formed based on the time-variant digital signal envelope 22. In this regard, the time-variant digital signal envelope 22, which is defined by the time-variant digital signal amplitudes 20, can be seen as a digital representation of the time-variant signal envelope 26.

The digital signal 18 may be modulated to include a digital in-phase signal 28I, which has a number of time-variant in-phase amplitudes I, and a digital quadrature signal 28Q, which has a number of time-variant quadrature amplitudes Q. In this regard, the time-variant digital signal amplitudes 20 of the digital signal 18 can be expressed as $\sqrt{I^2+Q^2}$.

The existing ET amplifier circuit 10 includes a mixer 30 that combines the time-variant digital signal amplitudes 20 with a digital voltage reference signal 32 to generate a digital target voltage reference signal 34. In this regard, the digital target voltage reference signal 34 is associated with the time-variant digital signal envelope 22 and, therefore, the time-variant digital signal amplitudes 20.

The existing ET amplifier circuit 10 includes lookup table (LUT) circuitry 36 (denoted as "LUT" in FIG. 1A), which may store a number of predetermined target voltage amplitude values corresponding to the time-variant digital signal amplitudes 20. In this regard, the LUT circuitry 36 converts the time-variant digital signal amplitudes 20 into a number of time-variant digital target voltage amplitudes 38 and associates the time-variant digital target voltage amplitudes 38 with a digital target voltage signal 40. As a result of such digital conversion, the time-variant digital target voltage amplitudes 38 may be distorted. For example, the LUT circuitry 36 can be non-strictly monotonic. As a result, a digital target voltage amplitude among the time-variant digital target voltage amplitudes 38 can become higher or lower than a corresponding digital signal amplitude among the time-variant digital signal amplitudes 20.

The existing ET amplifier circuit 10 includes a voltage digital-to-analog converter (DAC) 42 configured to convert the digital target voltage signal 40 into a target voltage signal 44 having a time-variant target voltage envelope 46 formed based on the time-variant digital target voltage amplitudes 38. The DAC 42 is configured to provide the target voltage signal 44 to the ET voltage circuit 14.

The ET voltage circuit 14 receives the target voltage signal 44 having the time-variant target voltage envelope 46. The time-variant target voltage envelope 46 may represent a time-variant target voltage $V_{TARGET}$ for the ET voltage circuit 14. The ET voltage circuit 14 is configured to generate an ET modulated voltage $V_{CC}$ having a time-variant voltage envelope 48 that tracks the time-variant target voltage envelope 46. The ET modulated voltage $V_{CC}$ is a time-variant ET modulated voltage formed based on the time-variant target voltage $V_{TARGET}$. Accordingly, the ET modulated voltage $V_{CC}$ tracks the time-variant target voltage $V_{TARGET}$.

The amplifier circuit 16 is coupled to the signal processing circuit 12 to receive the RF signal 24 having the time-variant signal envelope 26. The amplifier circuit 16 is also coupled to the ET voltage circuit 14 to receive the ET modulated voltage $V_{CC}$ corresponding to the time-variant voltage envelope 48. The amplifier circuit 16 is configured to amplify the RF signal 24 based on the ET modulated voltage $V_{CC}$. In this regard, to maintain linearity and efficiency in the amplifier circuit 16, the time-variant voltage envelope 48 of the ET modulated voltage $V_{CC}$ needs to align closely with the time-variant signal envelope 26 at the amplifier circuit 16.

However, the signal processing circuit 12, the LUT circuitry 36, the DAC 42, and the ET voltage circuit 14 may each incur processing/propagation delays. In addition, the amplifier circuit 16 may be a multi-stage amplifier including a driver stage 50 and an output stage 52 that also incur respective processing/propagation delays. As a result, the time-variant voltage envelope 48 may be out of alignment with the time-variant signal envelope 26 at the amplifier circuit 16.

In this regard, FIG. 1B is a graphic diagram providing an exemplary illustration of a temporal misalignment between the time-variant voltage envelope 48 and the time-variant signal envelope 26 of FIG. 1A. Elements of FIG. 1A are referenced in conjunction with FIG. 1B and will not be re-described herein.

If the time-variant signal envelope 26 and the time-variant voltage envelope 48 are perfectly aligned, an instantaneous amplitude of the RF signal 24 (not shown), which is represented by a voltage $V_S$, would substantially equal the ET modulated voltage $V_{CC}$ at time $t_x$. However, as shown in FIG. 1B, the time-variant signal envelope 26 lags behind the time-variant voltage envelope 48 by a temporal delay $\Delta t$. As such, at time $t_x$, the amplifier circuit 16 (not shown) receives a lower ET modulated voltage $V'_{CC}$, instead of the ET modulated voltage $V_{CC}$. In this regard, the time-variant voltage envelope 48 deviates from the time-variant signal envelope 26 by a voltage differential $\Delta v$ at time $t_x$. Consequently, the amplifier circuit 16 may suffer degraded linearity performance.

In a non-limiting example, the linearity performance of the amplifier circuit 16 can be measured by an adjacent channel leakage ratio (ACLR). The ACLR represents a ratio between in-band power and out-of-band leakage power. In this regard, a higher ACLR indicates a better linearity performance of the amplifier circuit 16. FIG. 1C is a graphic diagram providing an exemplary illustration of how the temporal delay $\Delta t$ of FIG. 1B can affect the ACLR of the amplifier circuit 16 of FIG. 1A. Elements of FIGS. 1A and 1B are referenced in conjunction with FIG. 1C and will not be re-described herein.

FIG. 1C includes a first ACLR curve 54 and a second ACLR curve 56. In a non-limiting example, the first ACLR curve 54 corresponds to an RF signal (e.g., the RF signal 24) modulated at 100 MHz bandwidth and the second ACLR curve 56 corresponds to an RF signal (e.g., the RF signal 24) modulated at 60 MHz bandwidth. As shown in FIG. 1C, the first ACLR curve 54 has a steeper slope compared to the second ACLR curve 56. In this regard, to achieve −32 dB ACLR, for example, the existing ET amplifier circuit 10 is confined to a delay budget of approximately 1.0 nanosecond (ns) when the RF signal 24 is modulated at 100 MHz bandwidth. In contrast, the existing ET amplifier circuit 10 would be subject to a more relaxed delay budget of approximately 1.3 ns for the same −32 dB ACLR when the RF signal 24 is modulated at 60 MHz bandwidth.

Notably, the RF signal 24 may be a long-term evolution (LTE) signal, which is typically modulated at up to 60 MHz modulation bandwidth or a fifth-generation new-radio (5G-NR) signal that is often modulated at more than 100 MHz modulation bandwidth. In this regard, the existing ET amplifier circuit 10 must adhere to a more stringent delay budget to achieve a desirable ACLR at the amplifier circuit 16 for communicating the RF signal 24 in a 5G-NR system.

With reference back to FIG. 1B, to mitigate linearity degradation and achieve the desirable ACLR at the amplifier circuit 16, it is necessary to reduce the temporal delay Δt between the time-variant voltage envelope 48 and the time-variant signal envelope 26. However, it may be difficult to do so adequately in the existing ET amplifier circuit 10 to satisfy the more stringent delay budget required for communicating a 5G-NR signal modulated at the higher modulation bandwidth (e.g., >100 MHz). As such, it may be desirable to improve delay tolerance of the existing ET amplifier circuit 10 to reduce linearity degradation caused by temporal misalignment between the time-variant voltage envelope 48 and the time-variant signal envelope 26.

Figure 2:
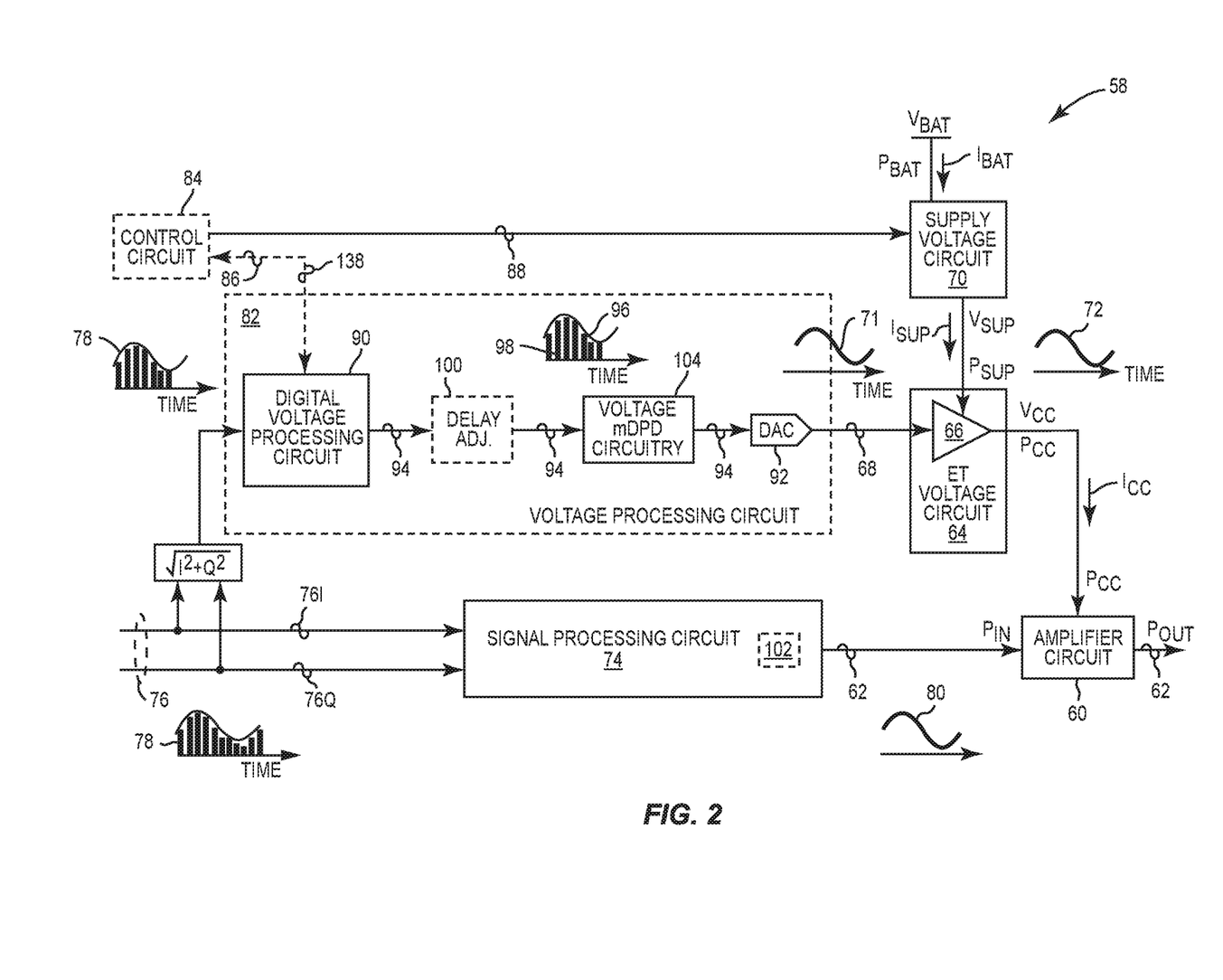
FIG. 2 is a schematic diagram of an exemplary ET amplifier circuit configured according an embodiment of the present disclosure to improve delay tolerance and maintain sufficient system-wide efficiency.

In this regard, FIG. 2 is a schematic diagram of an exemplary ET amplifier circuit 58 configured according an embodiment of the present disclosure to improve delay tolerance and maintain sufficient system-wide efficiency. The ET amplifier circuit 58 includes an amplifier circuit 60 configured to amplify an RF signal 62 from an input power $P_{IN}$ to an output power $P_{OUT}$ based on an ET modulated voltage $V_{CC}$ and a time-variant current $I_{CC}$. Collectively, the ET modulated voltage $V_{CC}$ and the time-variant current $I_{CC}$ provide a time-variant power $P_{CC}$ ($P_{CC}=V_{CC} \times I_{CC}$) to the amplifier circuit 60. Accordingly, the amplifier circuit 60 has an inherent amplifier circuit efficiency $E_{AMP}$ that can be determined based on the equation (Eq. 1) below.

$$E_{AMP}=P_{OUT}/P_{CC}=P_{OUT}/(V_{CC} \times I_{CC}) \quad \text{(Eq. 1)}$$

The ET amplifier circuit 58 includes an ET voltage circuit 64, which may be functionally equivalent to the ET voltage circuit 14 of FIG. 1A. The ET voltage circuit 64 is configured to generate the ET modulated voltage $V_{CC}$ and the time-variant current $I_{CC}$. More specifically, the ET voltage circuit 64 includes at least one voltage amplifier 66 configured to generate the ET modulated voltage $V_{CC}$ based on a supply voltage $V_{SUP}$ and a target voltage signal 68.

The ET amplifier circuit 58 includes a supply voltage circuit 70, which can be a micro inductance-based buck-boost (μLBB) circuit for example. The supply voltage circuit 70 is configured to generate the supply voltage $V_{SUP}$ and a supply current $I_{SUP}$ based on a battery voltage $V_{BAT}$ and a battery current $I_{BAT}$. Collectively, the supply voltage $V_{SUP}$ and the supply current $I_{SUP}$ provide a supply power $P_{SUP}$ ($P_{SUP}=V_{SUP} \times I_{SUP}$) to the ET voltage circuit 64. Accordingly, the ET voltage circuit 64 has an inherent voltage circuit efficiency $E_{CC}$ that can be determined based on the equation (Eq. 2) below.

$$E_{CC}=P_{CC}/P_{SUP}=(V_{CC} \times I_{CC})/(V_{SUP} \times I_{SUP}) \quad \text{(Eq. 2)}$$

Accordingly, an efficiency $E_{SUP}$ of the supply voltage circuit 70 and a system-wide efficiency $E_{SYS}$ of the ET amplifier circuit 58 can be determined based on the equations (Eq. 3 and Eq. 4) below.

$$E_{SUP}=P_{SUP}/P_{BAT}=(V_{SUP} \times I_{SUP})/(V_{BAT} \times I_{BAT}) \quad \text{(Eq. 3)}$$

$$E_{SYS}=E_{SUP} \times E_{CC} \times E_{AMP}=P_{OUT}/(V_{BAT} \times I_{BAT}) \quad \text{(Eq. 4)}$$

As discussed below in detail, the ET amplifier circuit 58 can be configured to dynamically reduce a dynamic range of the ET modulated voltage $V_{CC}$ to help reduce the voltage differential Δv in FIG. 1B independent of whether the temporal delay Δt in FIG. 1B is reduced. Hereinafter, the dynamic range of the ET modulated voltage $V_{CC}$ corresponds to a maximum level (peak) of the ET modulated voltage $V_{CC}$ minus a minimum level (bottom) of the ET modulated voltage $V_{CC}$. In examples discussed herein, the ET amplifier circuit 58 can be configured to reduce the dynamic range of the ET modulated voltage $V_{CC}$ by raising the ET modulated voltage $V_{CC}$, while maintaining the maximum level of the ET modulated voltage $V_{CC}$ (e.g., via soft clipping). By reducing the dynamic range of the ET modulated voltage $V_{CC}$, it may be possible to improve delay tolerance of the ET amplifier circuit 58, thus helping to improve linearity performance of the amplifier circuit 60.

However, when the minimum level of the ET modulated voltage $V_{CC}$ increases, the inherent amplifier circuit efficiency $E_{AMP}$ may decrease in accordance to the equation (Eq. 1). In this regard, according to an embodiment of the present disclosure, the supply voltage circuit 70 can be controlled to reduce the supply voltage $V_{SUP}$ in accordance to the reduced dynamic range of the ET modulated voltage $V_{CC}$. As the supply voltage $V_{SUP}$ decreases, the inherent voltage circuit efficiency $E_{CC}$ may increase according to the equation (Eq. 2). In the meantime, the efficiency $E_{SUP}$ of the supply voltage circuit 70 and the inherent amplifier circuit efficiency $E_{AMP}$ are relatively constant. Accordingly, the system-wide efficiency $E_{SYS}$ may also increase according to the equation (Eq. 4). As a result, it may be possible to maintain the system-wide efficiency $E_{SYS}$ at a defined level (e.g., approximately 19%), despite the decrease in the inherent amplifier circuit efficiency $E_{AMP}$. By reducing the dynamic range of the ET modulated voltage $V_{CC}$ and the supply voltage $V_{SUP}$, it may be possible to improve delay sensitivity and maintain sufficient system-wide efficiency in the ET amplifier circuit 58.

The target voltage signal 68 corresponds to a time-variant target voltage envelope 71 and the ET modulated voltage $V_{CC}$ corresponds to a time-variant voltage envelope 72 configured to track the time-variant target voltage envelope 71. In this regard, it may be possible to modify the time-variant voltage envelope 72, and therefore the ET modulated voltage $V_{CC}$, by modifying the time-variant target voltage envelope 71.

The ET amplifier circuit 58 includes a signal processing circuit 74, which may be functionally equivalent to the signal processing circuit 12 of FIG. 1A. The signal processing circuit 74 is configured to receive a digital signal 76 and convert the digital signal 76 into the RF signal 62. The signal processing circuit 74 may include digital pre-distortion (DPD) circuitry (not shown) to digitally pre-distort the digital signal 76 prior to converting the digital signal 76 into the RF signal 62. The digital signal 76 may be modulated to include a digital in-phase signal 76I, which has a number of time-variant in-phase amplitudes I, and a digital quadrature signal 76Q, which has a number of time-variant quadrature amplitudes Q. Accordingly, the digital signal 76 corresponds to a number of time-variant digital signal amplitudes 78. Each of the time-variant digital signal amplitudes 78 can be expressed as $\sqrt{I^2+Q^2}$. By converting the digital signal 76 into the RF signal 62, the RF signal 62 is associated with a time-variant signal envelope 80 formed based on the time-variant digital signal amplitudes 78.

Similar to the existing ET amplifier circuit 10 of FIG. 1A, the ET amplifier circuit 58 may cause the time-variant voltage envelope 72 to misalign with the time-variant signal envelope 80 at the amplifier circuit 60 due to inherent temporal delays. According to previous discussions of FIG. 1B, the misalignment between the time-variant voltage envelope 72 and the time-variant signal envelope 80 can constantly cause the voltage differential Δv at the amplifier circuit 60. As a result, the amplifier circuit 60 may suffer linearity degradation (e.g., degraded ACLR), particularly when the RF signal 62 is modulated with a high-bandwidth in excess of 100 MHz.

In this regard, the ET amplifier circuit 58 is configured to include a voltage processing circuit 82. The voltage processing circuit 82, the ET voltage circuit 64, and the amplifier circuit 60 may operate in a low-bandwidth mode and a high-bandwidth mode. In a non-limiting example, the voltage processing circuit 82, the ET voltage circuit 64, and the amplifier circuit 60 operate in the low-bandwidth mode when the RF signal 62 is modulated with less than or equal to 60 MHz (≤60 MHz) bandwidth and in the high-bandwidth mode when the RF signal 62 is modulated with more than 60 MHz (>60 MHz) bandwidth.

The ET amplifier circuit 58 includes a control circuit 84, which may be any type of microprocessor, microcontroller, and so on. In the high-bandwidth mode, the control circuit 84 may be configured to control the voltage processing circuit 82 via a first control signal 86 to cause the ET voltage circuit 64 to reduce the dynamic range of the ET modulated voltage $V_{CC}$ such that the voltage differential Δv (as shown in FIG. 1B) between the time-variant voltage envelope 72 and the time-variant signal envelope 80 can be reduced. The control circuit 84 is further configured to control the supply voltage circuit 70 via a second control signal 88 to reduce the supply voltage $V_{SUP}$ to the ET voltage circuit 64 in accordance to the reduced dynamic range of the ET modulated voltage $V_{CC}$ such that the system-wide efficiency $E_{SYS}$ can be maintained at the defined level.

In contrast, in the low-bandwidth mode, the control circuit 84 may control the voltage processing circuit 82 via the first control signal 86 such that the voltage processing circuit 82 does not to cause the ET voltage circuit 64 to reduce the dynamic range of the ET modulated voltage $V_{CC}$. The control circuit 84 is further configured to control the supply voltage circuit 70 via the second control signal 88 such that the supply voltage circuit 70 does not reduce the supply voltage $V_{SUP}$. In this regard, it may be possible to flexibly and dynamically toggle the ET amplifier circuit 58 between the low-bandwidth mode and the high-bandwidth mode.

The voltage processing circuit 82 includes a digital voltage processing circuit 90 and a DAC 92. The digital voltage processing circuit 90 is configured to receive the time-variant digital signal amplitudes 78 and generate a digital target voltage signal 94. In the low-bandwidth mode, the digital voltage processing circuit 90 generates the digital target voltage signal 94 corresponding to a number of time-variant digital target voltage amplitudes 96. Subsequently, the DAC 92 converts the digital target voltage signal 94 into the target voltage signal 68. Accordingly, the time-variant target voltage envelope 71 is formed based on, and thus tracking, the time-variant digital target voltage amplitudes 96.

In the high-bandwidth mode, the digital voltage processing circuit 90 generates the digital target voltage signal 94 corresponding to a number of time-variant modified digital target voltage amplitudes 98. Subsequently, the DAC 92 converts the digital target voltage signal 94 into the target voltage signal 68. Accordingly, the time-variant target voltage envelope 71 is formed based on, and thus tracking, the time-variant modified digital target voltage amplitudes 98. Given that the time-variant voltage envelope 72 tracks the time-variant target voltage envelope 71, the time-variant modified digital target voltage amplitudes 98 can cause the ET modulated voltage $V_{CC}$ to be modified accordingly. Further, since the time-variant signal envelope 80 and the time-variant voltage envelope 72 are both formed based on the time-variant digital signal amplitudes 78, it may be possible to reduce the voltage differential Δv between the time-variant voltage envelope 72 and the time-variant signal envelope 80 by modifying the ET modulated voltage $V_{CC}$. As a result, it may be possible to improve delay tolerance of the ET amplifier circuit 58, thus helping to reduce the linearity degradation at the amplifier circuit 60 to a predetermined threshold (e.g., a predetermined ACLR).

In addition to improving delay tolerance of the ET amplifier circuit 58, it may also be beneficial to further reduce the temporal delay Δt (as shown in FIG. 1B) between the time-variant voltage envelope 72 and the time-variant signal envelope 80. In this regard, the voltage processing circuit 82 may include delay adjustment circuitry 100 (denoted as "Delay Adj." in FIG. 2) to help reduce the temporal delay Δt between the time-variant voltage envelope 72 and the time-variant signal envelope 80. The signal processing circuit 74 may also include delay adjustment circuitry 102 for the same purpose. Furthermore, the voltage processing circuit 82 can include voltage memory digital pre-distortion (mDPD) circuitry 104. The voltage mDPD circuitry 104 can be configured to digitally pre-distort the digital target voltage signal 94 to help compensate for memory nonlinearity distortion in the ET voltage circuit 64.

Figure 3:
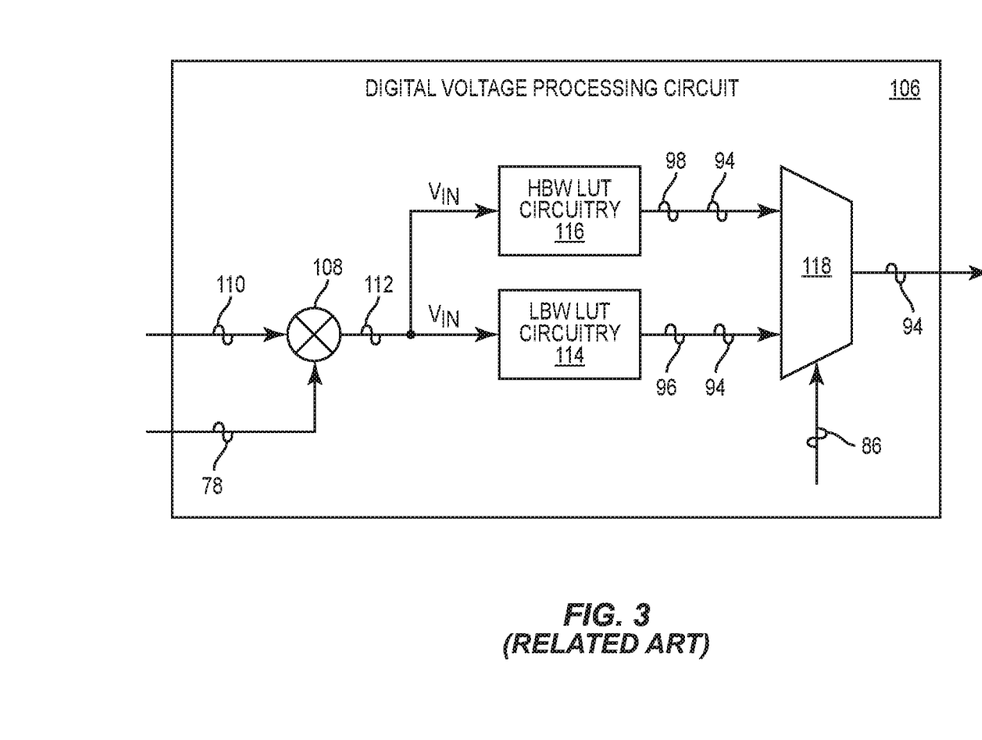
FIG. 3 is a schematic diagram of an exemplary digital voltage processing circuit configured according to one embodiment of the present disclosure and can be included in the ET amplifier circuit of FIG. 2.

The digital voltage processing circuit 90 may be configured based on a number of embodiments, which are discussed next. FIG. 3 is a schematic diagram of an exemplary digital voltage processing circuit 106 configured according to one embodiment of the present disclosure and can be included in the ET amplifier circuit 58 of FIG. 2 as the digital voltage processing circuit 90. Common elements between FIGS. 2 and 3 are shown therein with common element numbers and will not be re-described herein.

The digital voltage processing circuit 106 includes a mixer 108 configured to combine the time-variant digital signal amplitudes 78 with a digital voltage reference signal 110 to generate a digital target voltage reference signal 112. Accordingly, the digital target voltage reference signal 112 corresponds to the time-variant digital signal amplitudes 78, which can be represented by time-variant voltages $V_{IN}$.

The digital voltage processing circuit 106 includes low-bandwidth LUT circuitry 114 (denoted as "LBW LUT Circuitry") and high-bandwidth LUT circuitry 116 (denoted as "HBW LUT Circuitry"). Both the low-bandwidth LUT circuitry 114 and the high-bandwidth LUT circuitry 116 are configured to receive the digital target voltage reference signal 112 associated with the time-variant digital signal amplitudes 78. The low-bandwidth LUT circuitry 114 is further configured to generate the digital target voltage signal 94 corresponding to the time-variant digital target voltage amplitudes 96. The high-bandwidth LUT circuitry 116 is further configured to generate the digital target voltage signal 94 corresponding to the time-variant modified digital target voltage amplitudes 98.

The digital voltage processing circuit 106 includes a multiplexer 118 coupled to the low-bandwidth LUT circuitry 114 and the high-bandwidth LUT circuitry 116. The control circuit 84 (not shown) may control the multiplexer 118 to output the digital target voltage signal 94 having the time-variant modified digital target voltage amplitudes 98 in the high-bandwidth mode via the first control signal 86 (e.g., a logical HIGH). The control circuit 84 may also control the multiplexer 118 to output the digital target voltage signal 94 having the time-variant digital target voltage amplitudes 96 in the low-bandwidth mode via the first control signal 86 (e.g., a logical LOW).

The low-bandwidth LUT circuitry 114 may include a low-bandwidth LUT configured to correlate the time-variant digital target voltage amplitudes 96 with the time-variant digital signal amplitudes 78. Likewise, the high-bandwidth LUT circuitry 116 may include a high-bandwidth LUT configured to correlate the time-variant modified digital target voltage amplitudes 98 with the time-variant digital signal amplitudes 78. The time-variant modified digital target voltage amplitudes 98 stored in the high-bandwidth LUT may be determined in reference to the time-variant digital target voltage amplitudes 96 stored in the low-bandwidth LUT, as explained next in FIGS. 4A-4C.

Figure 4A:
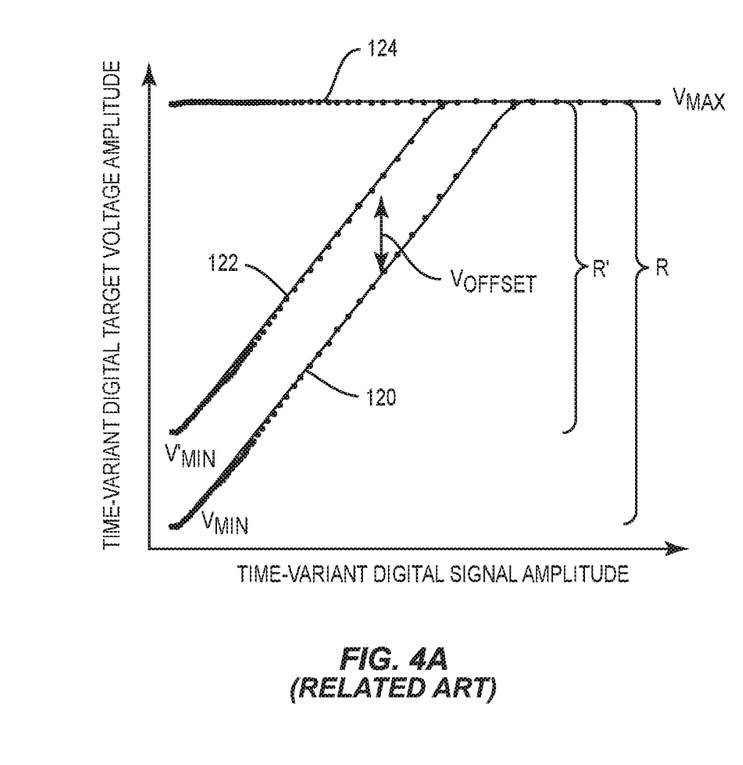
FIG. 4A is a graphic diagram providing an exemplary illustration of generating a number of time-variant modified digital voltage amplitudes based on one embodiment of the present disclosure.

FIG. 4A is a graphic diagram providing an exemplary illustration of generating the time-variant modified digital target voltage amplitudes 98 based on one embodiment of the present disclosure. FIG. 4A includes a first curve 120 representing a correlation between the time-variant digital signal amplitudes 78 and the time-variant digital target voltage amplitudes 96. The first curve 120 corresponds to a minimum voltage $V_{MIN}$. FIG. 4A also includes a second curve 122 representing a correlation between the time-variant digital signal amplitudes 78 and the time-variant modified digital target voltage amplitudes 98. The second curve 122 corresponds to a modified minimum voltage $V'_{MIN}$ ($V'_{MIN} > V_{MIN}$). The second curve 122 is parallel to the first curve 120, which indicates that the time-variant modified digital target voltage amplitudes 98 can be generated by adding a constant voltage offset $V_{OFFSET}$ to the time-variant digital target voltage amplitudes 96. Notably, the time-variant digital target voltage amplitudes 96 and the time-variant modified digital target voltage amplitudes 98 may conform to a common digital amplitude ceiling 124, which may be equal to a maximum voltage $V_{MAX}$ (e.g., 5.5 V). In this regard, the first curve 120 corresponds to a first dynamic range $R = V_{MAX} - V_{MIN}$ and the second curve 122 corresponds to a second dynamic range $R' = V_{MAX} - V'_{MIN}$. Given that $V'_{MIN} > V_{MIN}$, $R' < R$.

Figure 4B:
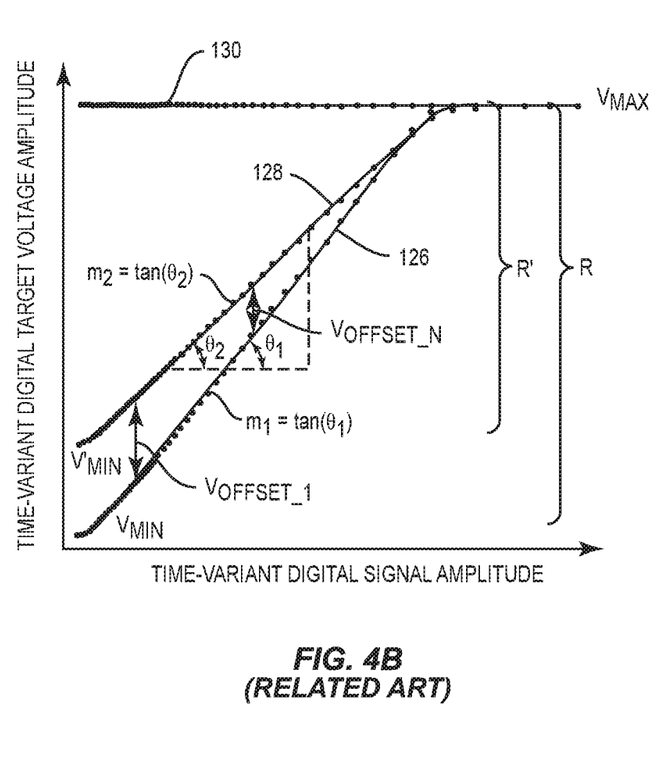
FIG. 4B is a graphic diagram providing an exemplary illustration of generating a number of time-variant modified digital voltage amplitudes based on another embodiment of the present disclosure.

FIG. 4B is a graphic diagram providing an exemplary illustration of generating the time-variant modified digital target voltage amplitudes 98 based on another embodiment of the present disclosure. FIG. 4B includes a first curve 126 representing a correlation between the time-variant digital signal amplitudes 78 and the time-variant digital target voltage amplitudes 96. The first curve 126 corresponds to a minimum voltage $V_{MIN}$. FIG. 4B also includes a second curve 128 representing a correlation between the time-variant digital signal amplitudes 78 and the time-variant modified digital target voltage amplitudes 98. The second curve 122 corresponds to a modified minimum voltage $V'_{MIN}$ ($V'_{MIN} > V_{MIN}$).

As shown in FIG. 4B, the first curve 126 corresponds to a first slope $m_1$ ($m_1 = \tan(\theta_1)$) and the second curve 128 corresponds to a second slope $m_2$ ($m_2 = \tan(\theta_2)$). Given that $\theta_1 > \theta_2$, the first slope $m_1$ is greater than the second slope $m_2$. In this regard, the second curve 128 has a reduced second slope $m_2$ relative to the first slope $m_1$. As such, the time-variant modified digital target voltage amplitudes 98 represented by the second curve 128 may be generated by applying a slope factor to the time-variant digital signal amplitudes 78 represented by the first curve 126. In a non-limiting example, the slope factor is less than 1. The first slope $m_1$ and a first intercept value associated with the first curve 126 may be applied by performing a linear fit of the first curve 126. The second slope $m_2$ may be generated by multiplying the first slope $m_1$ by the slope factor ($m_2 = m_1 \times$ slope factor). Subsequently, a second intercept value associated with the second curve 128 may be so determined to cause the first curve 126 and the second curve 128 to converge at a common digital amplitude ceiling 130, which may equal to a maximum voltage $V_{MAX}$ (e.g., 5.5 V).

In this regard, the second curve 128 represents a number of variable voltage offsets $V_{OFFSET-1} - V_{OFFSET-N}$ relative to the first curve 126. As such, the time-variant modified digital target voltage amplitudes 98 can be generated by adding the variable voltage offsets $V_{OFFSET-1} - V_{OFFSET-N}$ to the time-variant digital target voltage amplitudes 96. The first curve 126 corresponds to a first dynamic range $R = V_{MAX} - V_{MIN}$ and the second curve 128 corresponds to a second dynamic range $R' = V_{MAX} - V'_{MIN}$. Given that $V'_{MIN} > V_{MIN}$, $R' < R$.

Figure 4C:
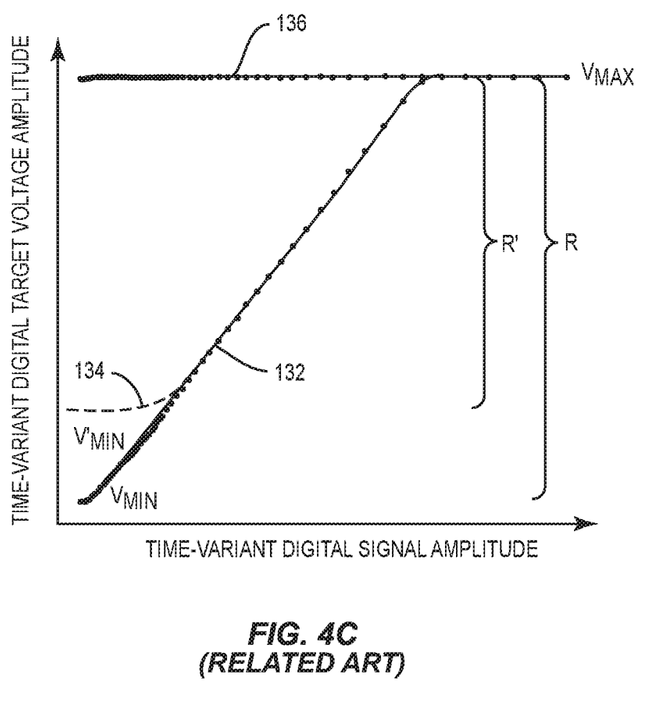
FIG. 4C is a graphic diagram providing an exemplary illustration of generating a number of time-variant modified digital voltage amplitudes based on another embodiment of the present disclosure.

FIG. 4C is a graphic diagram providing an exemplary illustrating of generating the time-variant modified digital target voltage amplitudes 98 based on another embodiment of the present disclosure.

FIG. 4C includes a first curve 132 representing a correlation between the time-variant digital signal amplitudes 78 and the time-variant digital target voltage amplitudes 96. The first curve 132 corresponds to a minimum voltage $V_{MIN}$. FIG. 4C also includes a second curve 134 representing a correlation between the time-variant digital signal amplitudes 78 and the time-variant modified digital target voltage amplitudes 98. The second curve 134 corresponds to a modified minimum voltage $V'_{MIN}$ ($V'_{MIN} > V_{MIN}$). In this regard, the modified minimum voltage $V'_{MIN}$ may be determined by raising the minimum voltage $V_{MIN}$. Notably, the time-variant digital target voltage amplitudes 96 and the time-variant modified digital target voltage amplitudes 98 may conform to a common digital amplitude ceiling 136, which may be equal to a maximum voltage $V_{MAX}$ (e.g., 5.5 V). In this regard, the first curve 132 corresponds to a first dynamic range $R = V_{MAX} - V_{MIN}$ and the second curve 134 corresponds to a second dynamic range $R' = V_{MAX} - V'_{MIN}$. Given that $V'_{MIN} > V_{MIN}$, $R' < R$.

With reference back to FIG. 2, the supply voltage $V_{SUP}$ is related to the dynamic range R, which can be determined based on any one of the embodiments discussed above in FIGS. 4A-4C, according to the equation (Eq. 5) below.

$$V_{SUP} = R + V_{Headroom} \qquad \text{(Eq. 5)}$$

In the equation (Eq. 5) above, $V_{Headroom}$ represents a headroom voltage, which can be 0.9 V for example. In this regard, the control circuit 84 may receive an indication signal 138 (shown in FIG. 2) indicative of the dynamic range R from the voltage processing circuit 82. Accordingly, the control circuit 84 may determine the supply voltage $V_{SUP}$ based on the equation (Eq. 5) above. The control circuit 84 may thus control the supply voltage circuit 70 to set the supply voltage $V_{SUP}$ accordingly.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier circuit comprising:
   an ET voltage circuit configured to operate in a low-bandwidth mode and a high-bandwidth mode, the ET voltage circuit comprising at least one voltage amplifier configured to generate an ET modulated voltage based on a supply voltage;
   a supply voltage circuit configured to provide the supply voltage to the at least one voltage amplifier;
   a voltage processing circuit configured to cause the ET voltage circuit to reduce a dynamic range of the ET modulated voltage in the high-bandwidth mode; and
   a control circuit configured to control the supply voltage circuit to reduce the supply voltage in the high-bandwidth mode based on the dynamic range of the ET modulated voltage.

2. The ET amplifier circuit of claim 1 wherein the voltage processing circuit is further configured to not cause the ET voltage circuit to reduce the dynamic range, and the control circuit is further configured to not control the supply voltage circuit to reduce the supply voltage in the low-bandwidth mode.

3. The ET amplifier circuit of claim 1 wherein the voltage processing circuit is further configured to reduce the dynamic range of the ET modulated voltage by raising a minimum level of the ET modulated voltage and maintaining a maximum level of the ET modulated voltage.

4. The ET amplifier circuit of claim 1 wherein the voltage processing circuit is further configured to reduce the dynamic range of the ET modulated voltage by raising the ET modulated voltage based on a constant voltage offset and maintaining a maximum level of the ET modulated voltage.

5. The ET amplifier circuit of claim 1 wherein the voltage processing circuit is further configured to reduce the dynamic range of the ET modulated voltage by raising the ET modulated voltage based on at least one variable voltage offset and maintaining a maximum level of the ET modulated voltage.

6. The ET amplifier circuit of claim 1 wherein the at least one voltage amplifier is further configured to generate the ET modulated voltage having a time-variant voltage envelope based on a target voltage having a time-variant target voltage envelope.

7. The ET amplifier circuit of claim 6 further comprising:
   a signal processing circuit configured to generate a radio frequency (RF) signal corresponding to a time-variant signal envelope; and
   an amplifier circuit configured to amplify the RF signal based on the ET modulated voltage;
   wherein the voltage processing circuit is further configured to cause the ET voltage circuit to reduce the dynamic range of the ET modulated voltage in the high-bandwidth mode to reduce linearity degradation caused by a temporal misalignment between the time-variant voltage envelope and the time-variant signal envelope at the amplifier circuit to a predetermined threshold.

8. The ET amplifier circuit of claim 7 wherein the control circuit is further configured to control the supply voltage circuit to reduce the supply voltage to cause a system-wide efficiency to be maintained at a defined level.

9. The ET amplifier circuit of claim 7 wherein:
   the voltage processing circuit comprises:
      a digital voltage processing circuit configured to:
         generate a digital target voltage signal corresponding to a plurality of time-variant digital target voltage amplitudes in the low-bandwidth mode; and
         generate the digital target voltage signal corresponding to a plurality of time-variant modified digital target voltage amplitudes in the high-bandwidth mode;
      a digital-to-analog converter (DAC) configured to:
         convert the digital target voltage signal into a target voltage signal having the time-variant target voltage envelope formed based on the plurality of time-variant digital target voltage amplitudes in the low-bandwidth mode; and
         convert the digital target voltage signal into the target voltage signal having the time-variant target voltage envelope formed based on the plurality of time-variant modified digital target voltage amplitudes in the high-bandwidth mode; and
   the ET voltage circuit is further configured to generate the ET modulated voltage having the time-variant voltage envelope formed based on the time-variant target voltage envelope.

10. The ET amplifier circuit of claim 9 wherein the signal processing circuit is further configured to:
    receive a digital signal corresponding to a plurality of time-variant digital signal amplitudes; and
    convert the digital signal into the RF signal having the time-variant signal envelope formed based on the plurality of time-variant digital signal amplitudes.

11. The ET amplifier circuit of claim 10 wherein the digital voltage processing circuit comprises:
    a mixer configured to combine the plurality of time-variant digital signal amplitudes with a digital voltage reference signal to generate a digital target voltage reference signal corresponding to the plurality of time-variant digital signal amplitudes;
    low-bandwidth look-up table (LUT) circuitry configured to:
       receive the digital target voltage reference signal; and
       generate the digital target voltage signal having the plurality of time-variant digital target voltage amplitudes based on the plurality of time-variant digital signal amplitudes; and
    high-bandwidth LUT circuitry configured to:
       receive the digital target voltage reference signal; and
       generate the digital target voltage signal having the plurality of time-variant modified digital target voltage amplitudes based on the plurality of time-variant digital signal amplitudes.

12. The ET amplifier circuit of claim 11 wherein the high-bandwidth LUT circuitry is further configured to generate the plurality of time-variant modified digital target voltage amplitudes by adding a constant voltage offset to the plurality of time-variant digital target voltage amplitudes, respectively.

13. The ET amplifier circuit of claim 11 wherein the high-bandwidth LUT circuitry is further configured to generate the plurality of time-variant modified digital target voltage amplitudes by adding a plurality of variable voltage offsets to the plurality of time-variant digital target voltage amplitudes, respectively.

14. The ET amplifier circuit of claim 13 wherein:
the plurality of time-variant digital target voltage amplitudes is associated with a first curve having a first slope; and
the plurality of time-variant modified digital target voltage amplitudes is associated with a second curve having a second slope smaller than the first slope.

15. The ET amplifier circuit of claim 14 wherein the first curve and the second curve converge at a common digital amplitude ceiling.

16. An envelope tracking (ET) amplifier circuit comprising:
an ET voltage circuit configured to operate in a low-bandwidth mode and a high-bandwidth mode, the ET voltage circuit comprising at least one voltage amplifier configured to generate an ET modulated voltage having a time-variant voltage envelope based on a supply voltage and a target voltage having a time-variant target voltage envelope;
a supply voltage circuit configured to provide the supply voltage to the at least one voltage amplifier;
a signal processing circuit configured to generate a radio frequency (RF) signal corresponding to a time-variant signal envelope;
an amplifier circuit configured to amplify the RF signal based on the ET modulated voltage;
a voltage processing circuit configured to cause the ET voltage circuit to reduce a dynamic range of the ET modulated voltage in the high-bandwidth mode; and
a control circuit configured to control the supply voltage circuit to reduce the supply voltage in the high-bandwidth mode based on the dynamic range of the ET modulated voltage to cause a system-wide efficiency to be maintained at a defined level.

17. The ET amplifier circuit of claim 16 wherein the voltage processing circuit is further configured to cause the ET voltage circuit to reduce the dynamic range of the ET modulated voltage in the high-bandwidth mode to reduce linearity degradation caused by a temporal misalignment between the time-variant voltage envelope and the time-variant signal envelope at the amplifier circuit to a predetermined threshold.

18. The ET amplifier circuit of claim 17 wherein the voltage processing circuit is further configured to not cause the ET voltage circuit to reduce the dynamic range and the control circuit is further configured to not control the supply voltage circuit to reduce the supply voltage in the low-bandwidth mode.

19. The ET amplifier circuit of claim 17 wherein the voltage processing circuit is further configured to reduce the dynamic range of the ET modulated voltage by raising a minimum level of the ET modulated voltage and maintaining a maximum level of the ET modulated voltage.

20. The ET amplifier circuit of claim 17 wherein the voltage processing circuit is further configured to reduce the dynamic range of the ET modulated voltage by raising the ET modulated voltage based on a constant voltage offset and maintaining a maximum level of the ET modulated voltage.

21. The ET amplifier circuit of claim 17 wherein the voltage processing circuit is further configured to reduce the dynamic range of the ET modulated voltage by raising the ET modulated voltage based on at least one variable voltage offset and maintaining a maximum level of the ET modulated voltage.

* * * * *